United States Patent
Kayiran et al.

(10) Patent No.: US 11,398,831 B2
(45) Date of Patent: Jul. 26, 2022

(54) TEMPORAL LINK ENCODING

(71) Applicant: ADVANCED MICRO DEVICES, INC., Santa Clara, CA (US)

(72) Inventors: Onur Kayiran, Fairport, NY (US); Steven Raasch, Boxborough, MA (US); Sergey Blagodurov, Bellevue, WA (US); Jagadish B. Kotra, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 16/869,207

(22) Filed: May 7, 2020

(65) Prior Publication Data

US 2021/0351787 A1 Nov. 11, 2021

(51) Int. Cl.
*H04L 27/18* (2006.01)
*H03M 7/30* (2006.01)

(52) U.S. Cl.
CPC .......... *H03M 7/3073* (2013.01); *H04L 27/18* (2013.01)

(58) Field of Classification Search
CPC .............................. H03M 7/3073; H04L 27/18
USPC .......................................................... 375/295
See application file for complete search history.

(56) References Cited

U.S. PATENT DOCUMENTS

| | | | | |
|---|---|---|---|---|
| 2003/0188154 A1* | 10/2003 | Dallard | .............. | H04N 21/2225 713/153 |
| 2006/0114131 A1* | 6/2006 | Kolavi | .................... | H03M 7/30 341/50 |
| 2010/0081958 A1* | 4/2010 | She | ......................... | G06F 3/015 600/544 |
| 2010/0220814 A1* | 9/2010 | Wu | ....................... | H04L 1/0656 375/295 |
| 2020/0279180 A1* | 9/2020 | Yu | ............................ | G06N 5/04 |

OTHER PUBLICATIONS

Esmailzadeh et al, "Architecture Support for Disciplined Approximate Programming", ASPLOS XVII: Proceedings of the Seventeenth International Conference on Architectural Support for Programming Languages and Operating Systems, Mar. 2012, pp. 301-312, URL: https://doi.org/10.1145/2150976.2151008.
Keeton et al., "Persistent memory: new tier or storage replacement?", SNIA Storage Developer Conference, Sep. 2017, 43 pages, Hewlett Packard Labs (online), URL: https://www.snia.org/sites/default/files/SDC/2017/presentations/General_Session/Keeton_Kimberly_Spence_Susan_Persistent_Memory_New_Tier_or_Storage_Replacement.pdf.
Smith, "Temporal Coding", Chapter 1, Section 1.3.2 of "Space-Time Computing with Temporal Neural Networks", Synthesis Lectures on Computer Architecture #39, May 2017, pp. 16-17, Morgan & Claypool Publishers, San Rafael, California.
Unknown, "How RS232 works", accessed Feb. 12, 2020, 10 pages, URL: https://www.best-microcontroller-projects.com/how-rs232-works.html.

\* cited by examiner

*Primary Examiner* — Ted M Wang

(57) ABSTRACT

Temporal link encoding, including: identifying a data type of a data value to be transmitted; determining that the data type is included in one or more data types for temporal encoding; and transmitting the data value using temporal encoding.

19 Claims, 10 Drawing Sheets

TEMPORAL LINK ENCODING

STATEMENT REGARDING FEDERALLY SPONSORED RESEARCH OR DEVELOPMENT

This invention was made with Government support under Prime Contract No. DE-AC52-07NA27344, Subcontract No. B620717, awarded by the Department of Energy. The Government has certain rights in this invention.

BACKGROUND

Temporal encoding is a power- and bandwidth-efficient approach for encoding and transmitting data. However, as the size of a data payload increases, the latency introduced by temporal encoding also increases. With temporal encoding, transmission is performed by sending two spikes across a link; the data value to be transmitted is equal to the time observed between these two spikes.

DETAILED DESCRIPTION

Figure 1:
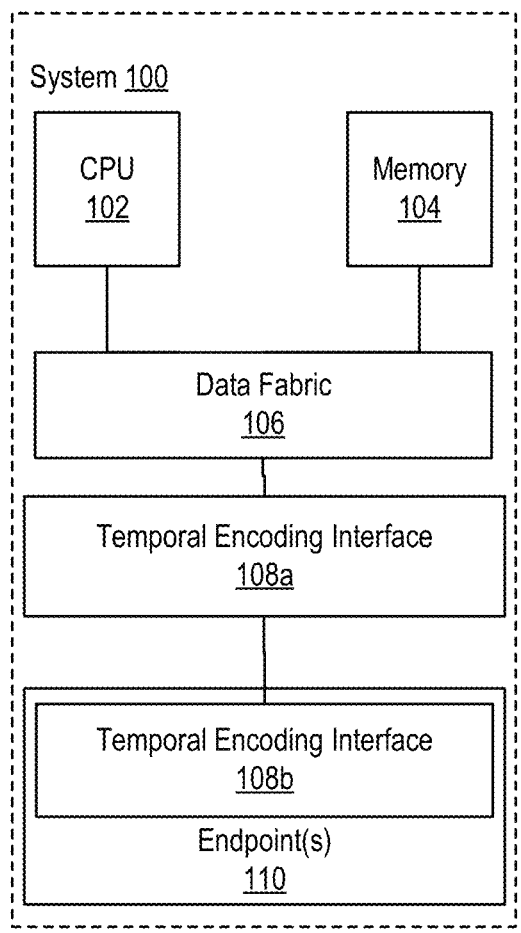
FIG. 1 is a block diagram of an example processor for temporal link encoding according to some embodiments.

In some embodiments, a method of temporal link encoding includes identifying a data type of a data value to be transmitted; determining that the data type is included in one or more data types for temporal encoding; and transmitting the data value using temporal encoding.

In some embodiments, determining that the data type is included in one or more data types for temporal encoding includes determining that a number of bits required to encode the data type falls below a threshold. In some embodiments, determining that the data type is included in one or more data types for temporal encoding includes identifying an indicator that the data type should be encoded using temporal encoding. In some embodiments, the data value is transmitted based on a first time window, and the method further includes transmitting another data value using temporal encoding based on a second time window overlapping the first time window. In some embodiments, transmitting the data value using temporal encoding includes transmitting a plurality of temporally encoded messages. In some embodiments, determining that the data type is included in one or more data types for temporal encoding is based on one or more of a latency requirement or a bandwidth requirement of an application. In some embodiments, transmitting the data value using the temporal encoding includes: transmitting a start signal; transmitting an end signal; and the method further includes transmitting one or more other data values based on the start signal and one or more other end signal.

In some embodiments, an apparatus for temporal link encoding performs steps including identifying a data type of a data value to be transmitted; determining that the data type is included in one or more data types for temporal encoding; and transmitting the data value using temporal encoding.

In some embodiments, determining that the data type is included in one or more data types for temporal encoding includes determining that a number of bits required to encode the data type falls below a threshold. In some embodiments, determining that the data type is included in one or more data types for temporal encoding includes identifying an indicator that the data type should be encoded using temporal encoding. In some embodiments, the data value is transmitted based on a first time window, and the steps further include transmitting another data value using temporal encoding based on a second time window overlapping the first time window. In some embodiments, transmitting the data value using temporal encoding includes transmitting a plurality of temporally encoded messages. In some embodiments, determining that the data type is included in one or more data types for temporal encoding is based on one or more of a latency requirement or a bandwidth requirement of an application. In some embodiments, transmitting the data value using the temporal encoding includes: transmitting a start signal; transmitting an end signal; and the steps further include transmitting one or more other data values based on the start signal and one or more other end signal.

In some embodiments, a computer program product disposed upon a non-transitory computer readable medium includes computer program instructions for temporal link encoding that, when executed, cause a computer system to perform steps including identifying a data type of a data value to be transmitted; determining that the data type is included in one or more data types for temporal encoding; and transmitting the data value using temporal encoding.

In some embodiments, determining that the data type is included in one or more data types for temporal encoding includes determining that a number of bits required to encode the data type falls below a threshold. In some embodiments, determining that the data type is included in one or more data types for temporal encoding includes identifying an indicator that the data type should be encoded using temporal encoding. In some embodiments, the data value is transmitted based on a first time window, and the steps further include transmitting another data value using temporal encoding based on a second time window overlapping the first time window. In some embodiments, transmitting the data value using temporal encoding includes transmitting a plurality of temporally encoded messages. In some embodiments, determining that the data type is included in one or more data types for temporal encoding is based on one or more of a latency requirement or a bandwidth requirement of an application. In some embodiments, transmitting the data value using the temporal encoding includes: transmitting a start signal; transmitting an end signal; and the steps further include transmitting one or more other data values based on the start signal and one or more other end signal.

FIG. 1 is a block diagram of a non-limiting example system 100 for temporal link encoding. The system 100 can be implemented in a variety of computing devices, including mobile devices, personal computers, peripheral hardware components, gaming devices, set-top boxes, servers and the like. The system 100 includes a central processing unit (CPU) 102. The CPU 102 is communicatively coupled to memory 104 via a data fabric 106. The memory 104 includes on-chip or on-board memory such as Random Access Memory (RAM), etc. The data fabric 106 includes one or more busses, switches, interconnects, or links to allow data transfer between the CPU 102 and memory 104.

Also coupled to the data fabric 106 is a temporal encoding interface 108a. The temporal encoding interface 108a encodes a data value from the CPU 102 or memory 104 into a temporally encoded data value. A data value is temporally encoded in that its value is dependent on a time difference between two spikes (e.g., two spikes applied to a link between the temporal encoding interface 108 and a temporal encoding interface 108b of an endpoint 110. A spike is a temporary increase in current or voltage applied to a link. For example, four bits are used to binary encode sixteen different values each depending on whether or not power is applied to four lines of a bus or link. Using temporal encoding, each of these sixteen values would instead correspond to a different time difference between spikes applied to a single line or link. The temporal encoding interface 108a encodes a data value using temporal encoding along a link to a temporal encoding interface 108b. The temporal encoding interface 108b decodes the temporally encoded data value for use by an endpoint 110. The endpoint 110 includes any hardware component capable of communicating with the CPU 102 and memory 104, such as a peripheral device (e.g., graphics processing unit (GPU), network interface, etc.). In some embodiments, the endpoint 110 includes another internal component of the data fabric. The temporal encoding interface 108b also temporally encodes data values from the endpoint 110 for decoding by the temporal encoding interface 108a.

In some embodiments, the clock or cycle speeds used to synchronize the temporal encoding endpoints 108a/b are increased to reduce latency. The increased clock speed results in a risk of imprecise decoding due to inaccurate clock synchronization across the link endpoints. Accordingly, temporal encoding is used where the data values are associated with approximate or error-tolerant computation.

As temporal encoding of data only requires spikes across links, the bandwidth used is very low, but can cause increased latency. For example, assuming a 64-line bus, a 64-bit value can be transmitted using binary encoding in a single cycle, but would result in high latency if transmitted using temporal encoding. Accordingly, temporal encoding is most advantageous for transmitting low data values. A temporal encoding interface 108a can determine whether a data value is of a data type that should be transmitted using temporal encoding. For example, the temporal encoding interface 108a can receive a data value via the data fabric 106. Where a number of bits required to express the data value falls below a threshold (e.g., a one-bit Boolean value, a four-bit value), the temporal encoding interface 108a can determine to send the data value using temporal encoding. As another example, an identifier (e.g., included in programmable code by a developer or during code compilation) can indicate that the data value should be transmitted using temporal encoding. As a further example, metadata or other data can indicate that a particular application has performance sensitivities to bandwidth or latency. Where an application is bandwidth sensitive, temporal encoding can be used for data values. Where an application is latency sensitive, other encoding (e.g., binary encoding) is used.

Figure 2:
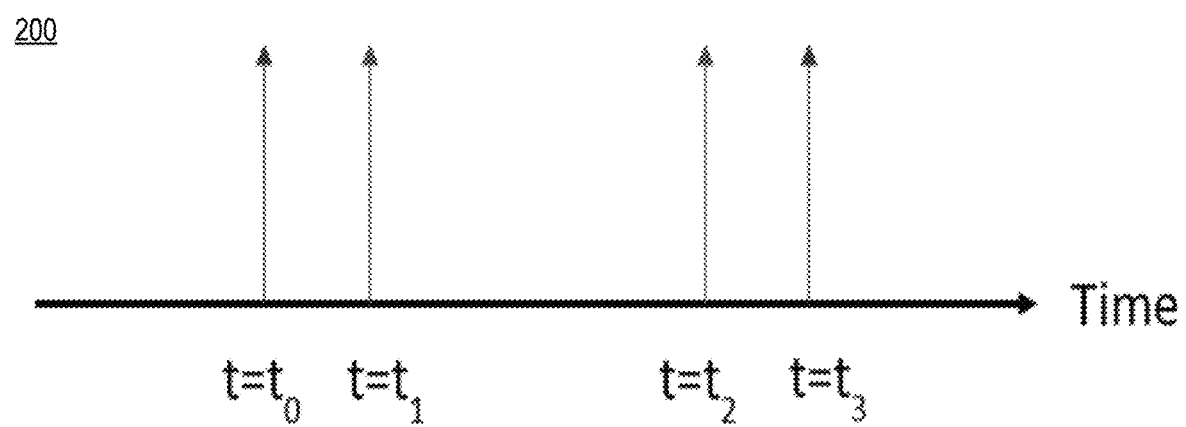
FIG. 2 is an example timeline for temporal link encoding according to some embodiments.

For further explanation FIG. 2 shows a timeline 200 for using temporal encoding to send messages between multiple pairs of senders and receivers across the same link. In this example, a first sender sends a first message by initiating a first spike at $t_0$ and a second spike at $t_3$. Accordingly, the value of the first message is determined based on $t_3$-$t_0$. A second message (e.g., from a same or different sender, to a same or different receiver) is sent on the same link by sending a first spike at $t_1$ and a second spike at $t_2$. Accordingly, the value of the second message is determined based on $t_2$-$t_1$. In this example, the latency limitations of temporal encoding are reduced by allowing for two messages to be sent on the same link with overlapping time windows.

In order to send temporally encoded messages with overlapping time windows, the temporal encoding interfaces 108a/b must identify the intended recipients of the spikes. In some embodiments, each sender, receiver, and/or sender/receiver pair corresponds to a different amplitude. Thus, the amplitude of a spike indicates to which message it corresponds. In the example timeline 200, $t_0$ and $t_3$ would be sent at a first amplitude, and $t_1$ and $t_2$ would be sent at a second amplitude (not shown in FIG. 2). In other embodiments, metadata is sent to identify the sender and/or receiver of a spike. For example, the metadata is sent along another channel, or in a time window previous to the spike.

Figure 3:
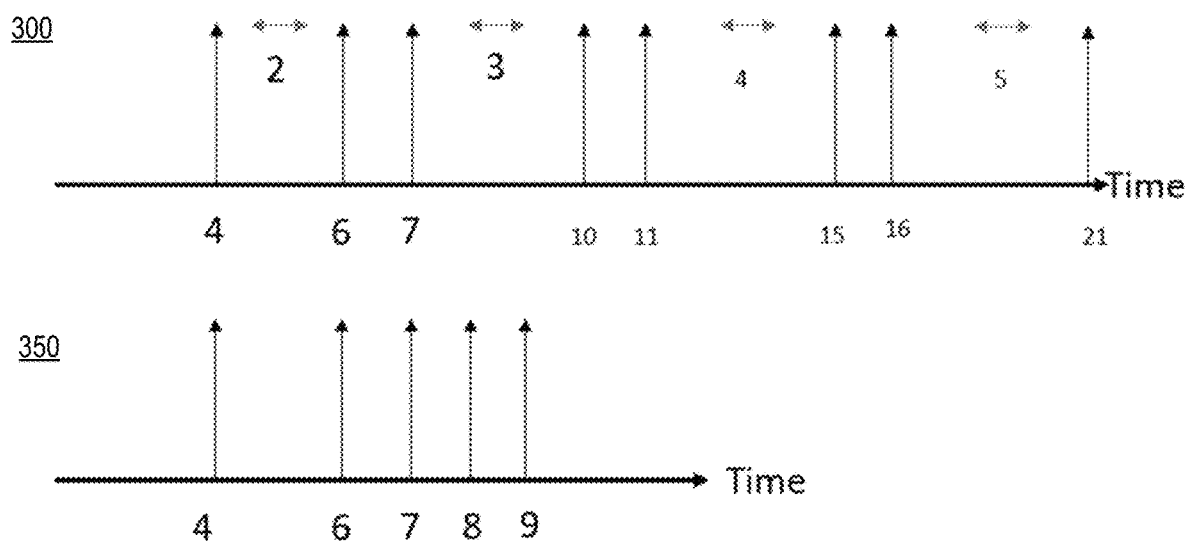
FIG. 3 is an example timeline for temporal link encoding according to some embodiments.

For further explanation FIG. 3 shows a timeline 300 for temporal link encoding. In the timeline 300, four values are encoded using seventeen cycles (e.g., from time 4 to time 21, with one cycle between an end spike and the next start spike). To reduce the overall latency, in the timeline 350, a single start spike is sent. Four end spikes are used to indicate the four values, each relative to the single start spike. Thus, the same four values illustrated by timeline 300 are sent using five cycles in timeline 350 instead of the seventeen cycles illustrated by timeline 300. In some embodiments, metadata is sent prior to the start spike to indicate a number of values to be calculated relative to the same start spike (e.g., a number of end spikes to be sent). Thus, overall latency is reduced and link utilization is increased.

Figure 4:
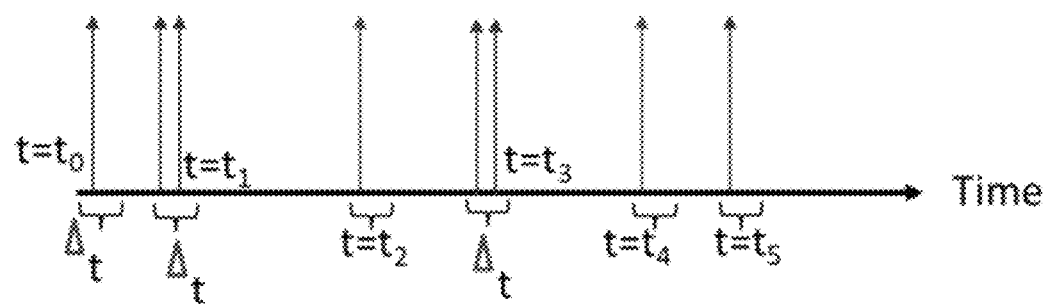
FIG. 4 is an example timeline for temporal link encoding according to some embodiments.

For further explanation FIG. 4 shows a timeline 400 for temporal link encoding. In this example, the number of spikes in duration of (delta-t) represents a message-ID. This variable number of spikes in a (delta-t) time represents the corresponding message-ID. Hence a receiver can interpret the message-ID over a (delta-t) duration. The receiver maintains a table of all the pending message-IDs and maintains the time-stamps of different message-IDs in that table. Based on the message-ID interpreted, receiver can look up the table and use the timestamp noted as the start timestamp. In the example timeline 400, the values transmitted between sender-N and receiver-N can be calculated as follows:

Value-1 from Sender-$N$=$t5$−(delta-$t$)−$t0$−(delta-$t$)

Value-2 from Sender-$N$=$t3$−(delta-$t$)−$t1$−(delta-$t$)

where, value-1 is initiated at time to and value-2 is initiated at time $t_1$ and they are received at time stamps $t_3$ and $t_5$, respectively.

Figure 5:
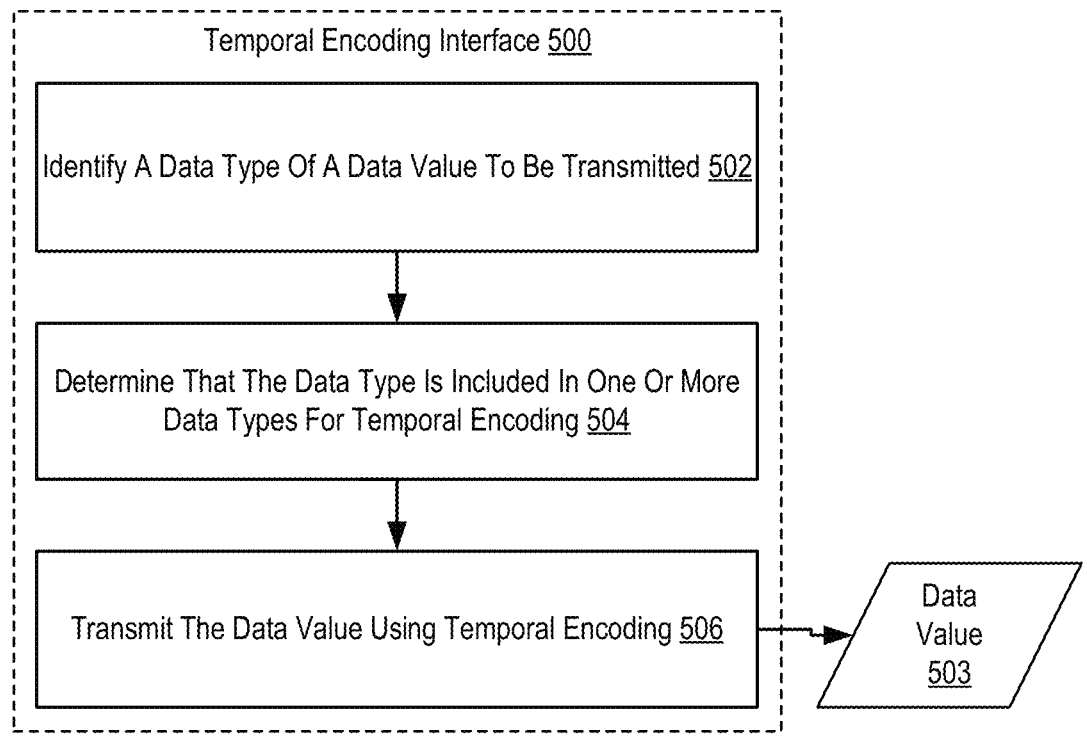
FIG. 5 is a flowchart of an example method for temporal link encoding according to some embodiments.

For further explanation, FIG. 5 sets forth a flow chart illustrating an exemplary method for temporal link encoding that includes identifying 502 (e.g., by a temporal encoding interface 500) a data type of a data value 503 to be transmitted. In some embodiments, identifying 502 the data type of the data value 503 includes identifying an object type, data structure, primitive type, or other classifier for the data value. For example, the temporal encoding interface 500 determines if the data value 503 is a Boolean value, a character (e.g., a "char") value, an n-bit numerical value, a particular data structure, etc. In other embodiments, identifying 502 the data type of the data value 503 includes determining a number of bits required to express the data value 503 using binary encoding (e.g., one bit for a Boolean value, four bits for a nibble, eight bits for a byte, etc.). In further embodiments, identifying 502 the data type of the data value 503 to be transmitted includes determining if a programmer- or compiler-generated tag or identifier is associated with the data value 503.

The method of FIG. 5 also includes determining 504 that the data type is included in one or more data types for temporal encoding. In one embodiment, the temporal encoding interface 500 maintains a list or enumeration of data types (e.g., data structures, primitive types, etc.) that should be transmitted using temporal encoding. As an example, the list indicates that Boolean values and eight-bit "char" values should be transmitted using temporal encoding. In another embodiment, determining 504 that the data type is included in one or more data types for temporal encoding includes determining that a number of bits required to express the data type falls below a threshold (e.g., four bits, eight bits, etc.).

The method of FIG. 5 also includes transmitting 506 the data value 503 using temporal encoding. For example, the temporal encoding interface 500 applies a first spike to a link to indicate the start of a time window and a second spike to the link to indicate an end of the time window. The duration of the time window encodes the data value 503 according to a predetermined temporal encoding scheme. In some embodiments, transmitting 506 the data value 503 using temporal encoding includes sending metadata previous to the first spike (e.g., using temporal or binary encoding, using a same or different link). The metadata includes, for example, message identifiers, sender identifiers, and/or recipient identifiers, etc.

Figure 6:
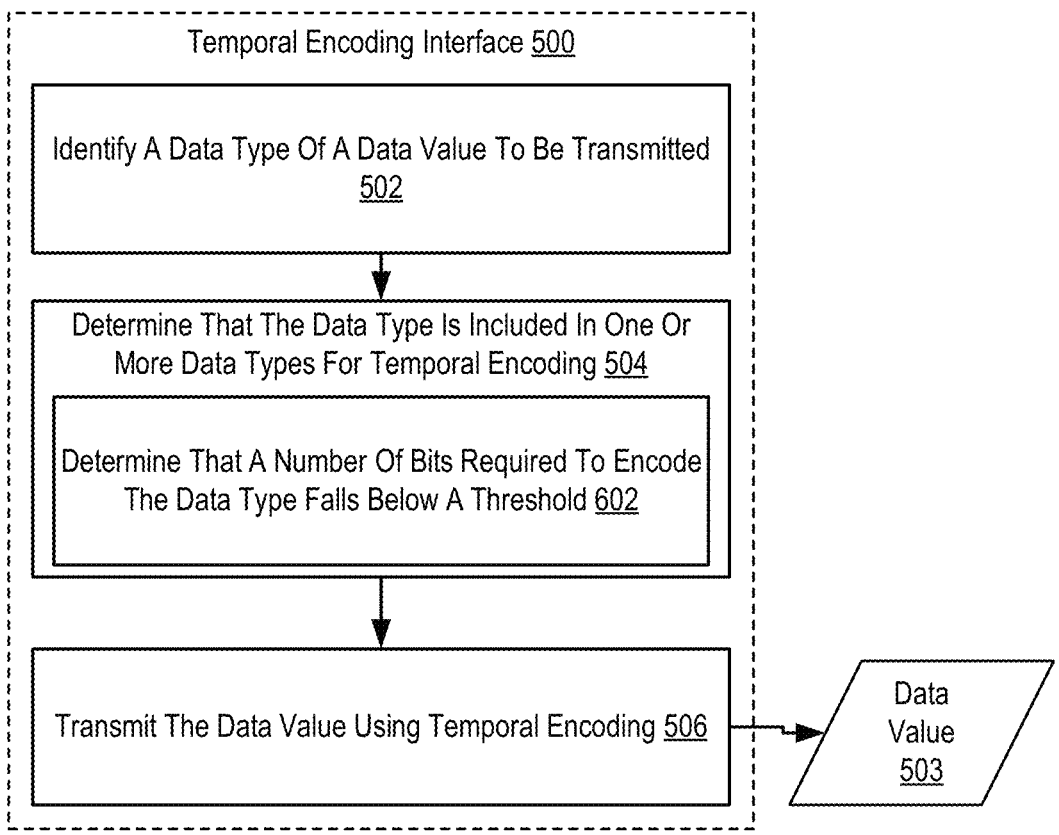
FIG. 6 is a flowchart of an example method for temporal link encoding according to some embodiments.

For further explanation, FIG. 6 sets forth a flow chart illustrating an exemplary method for temporal link encoding that includes identifying 502 (e.g., by a temporal encoding interface 500) a data type of a data value 503 to be transmitted; determining 504 that the data type is included in one or more data types for temporal encoding; and transmitting 506 the data value 503 using temporal encoding.

The method of FIG. 6 differs from FIG. 5 in that determining 504 that the data type is included in one or more data types for temporal encoding includes determining 602 that a number of bits required to encode the data type falls below a threshold. As the latency introduced by temporal encoding increases for higher data values (e.g., data values requiring more bits to express using binary encoding), the temporal encoding interface 500 preferentially selects low value data types (e.g., requiring fewer bits to encode) for temporal encoding. For example, assuming an eight-bit threshold, the temporal encoding interface 500 would select data structures and primitives that are encoding using eight or fewer bits, such as eight-bit characters, single-bit Boolean values, etc.

Figure 7:
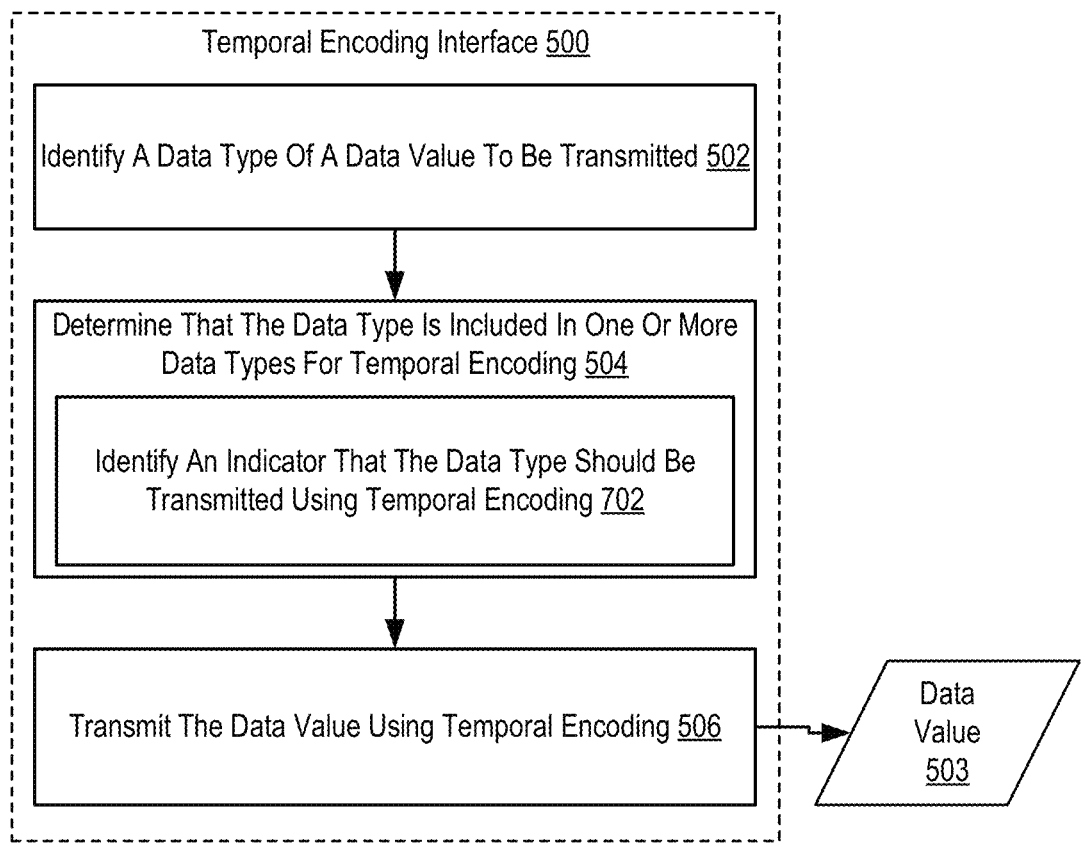
FIG. 7 is a flowchart of an example method for temporal link encoding according to some embodiments.

For further explanation, FIG. 7 sets forth a flow chart illustrating an exemplary method for temporal link encoding that includes identifying 502 (e.g., by a temporal encoding interface 500) a data type of a data value 503 to be transmitted; determining 504 that the data type is included in one or more data types for temporal encoding; and transmitting 506 the data value 503 using temporal encoding.

The method of FIG. 7 differs from FIG. 5 in that determining 504 that the data type is included in one or more data types for temporal encoding includes identifying an indicator that the data type should be transmitted using temporal encoding 702. For example, a flag, identifier, or other indicator for a value indicates that the data value 503 should be transmitted using temporal encoding. In some embodiments, a programmer or other generator of source code indicates that a particular value (e.g., when declaring a variable, when defining a function, etc.) should be sent using temporal encoding. In other embodiments, a compiler inserts a flag or identifier indicating that the data value 503 should be sent using temporal encoding. For example, the compiler inserts the identifier for data values 503 of a particular data structure or primitive type, of a particular number of bits, etc.

Figure 8:
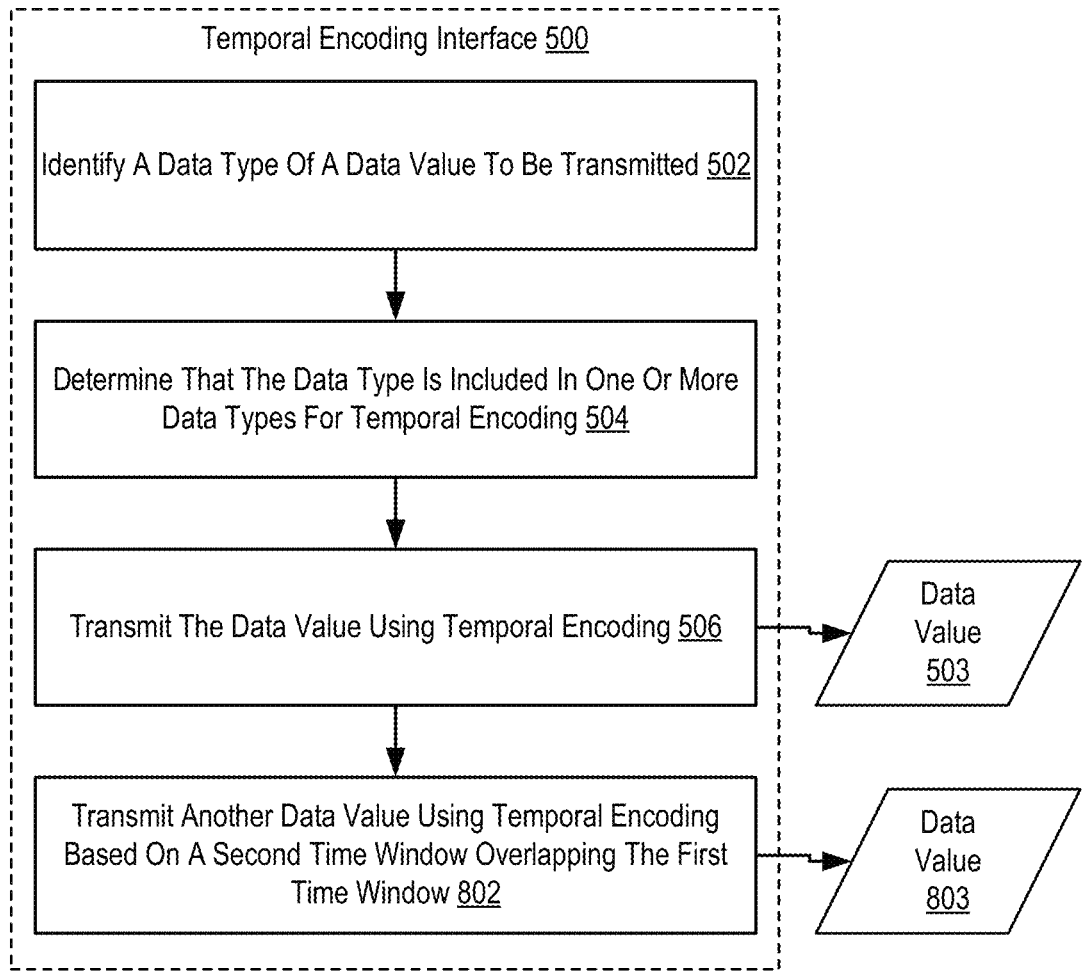
FIG. 8 is a flowchart of an example method for temporal link encoding according to some embodiments.

For further explanation, FIG. 8 sets forth a flow chart illustrating an exemplary method for temporal link encoding that includes identifying 502 (e.g., by a temporal encoding interface 500) a data type of a data value 503 to be transmitted; determining 504 that the data type is included in one or more data types for temporal encoding; and transmitting 506 the data value 503 using temporal encoding.

The method of FIG. 8 differs from FIG. 5 in that the method of FIG. 8 also includes transmitting 802 another data value 803 based on a second time window overlapping the first time window (e.g., a time window used to define the data value 503). For example, assume that the first data value 503 is transmitted 506 using a first start spike and a first end spike. A second data value 803 is transmitted 802 using a second start spike and a second end spike. The second start spike and/or the second end spike are transmitted between the first start spike and first end spike. Thus, a first time window defined by the first start spike and first end spike overlap a second time window defined by the second start spike and the second end spike.

In some embodiments, the first start and end spikes differ in amplitude from the second start and end spikes. Thus, the first data value 503 is encoded using a first time window bound by spikes of a first amplitude and the second data value 803 is encoded using a second time window bound by spikes of a second amplitude. Thus, temporal encoding interfaces distinguish between spikes for different data values. In other embodiments, metadata is sent (e.g., using temporal or binary encoding) prior to start and end spikes to indicate to which data value 503, 803 the spike corresponds.

Figure 9:
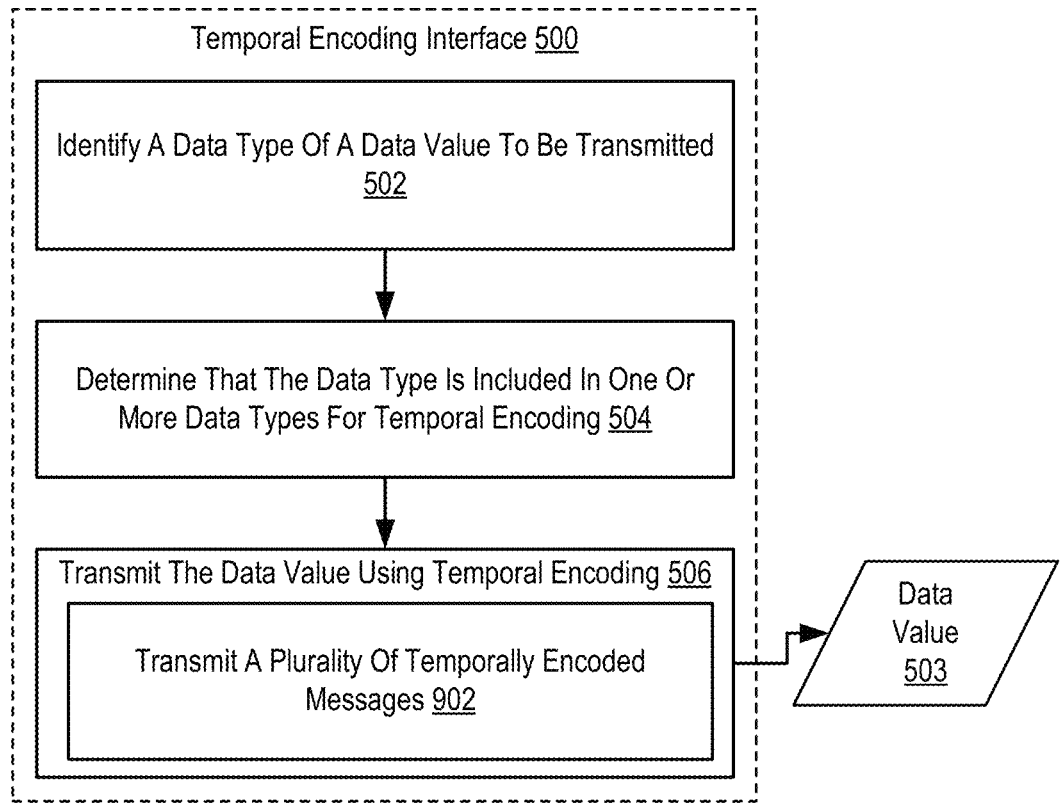
FIG. 9 is a flowchart of an example method for temporal link encoding according to some embodiments.

For further explanation, FIG. 9 sets forth a flow chart illustrating an exemplary method for temporal link encoding that includes identifying 502 (e.g., by a temporal encoding interface 500) a data type of a data value 503 to be transmitted; determining 504 that the data type is included in one or more data types for temporal encoding; and transmitting 506 the data value 503 using temporal encoding.

The method of FIG. 9 differs from FIG. 5 in that transmitting 506 using temporal encoding includes transmitting 902 a plurality of temporally encoded messages. In some embodiments, the data value 503 is divided into a plurality of data segments, with each segment being transmitted 902 as a temporally encoded message. Each data segment is based on a number of bits or other criteria. As an example, assume the binary number 1111 requires 15 temporally encoded cycles. The binary number 1111 1111 requires 255 temporally encoded cycles. Instead, the binary number 1111 1111 is sent as two 15-cycle data segments, plus metadata overhead indicating that a data value 503 split into data segments has been or will be transmitted.

Figure 10:
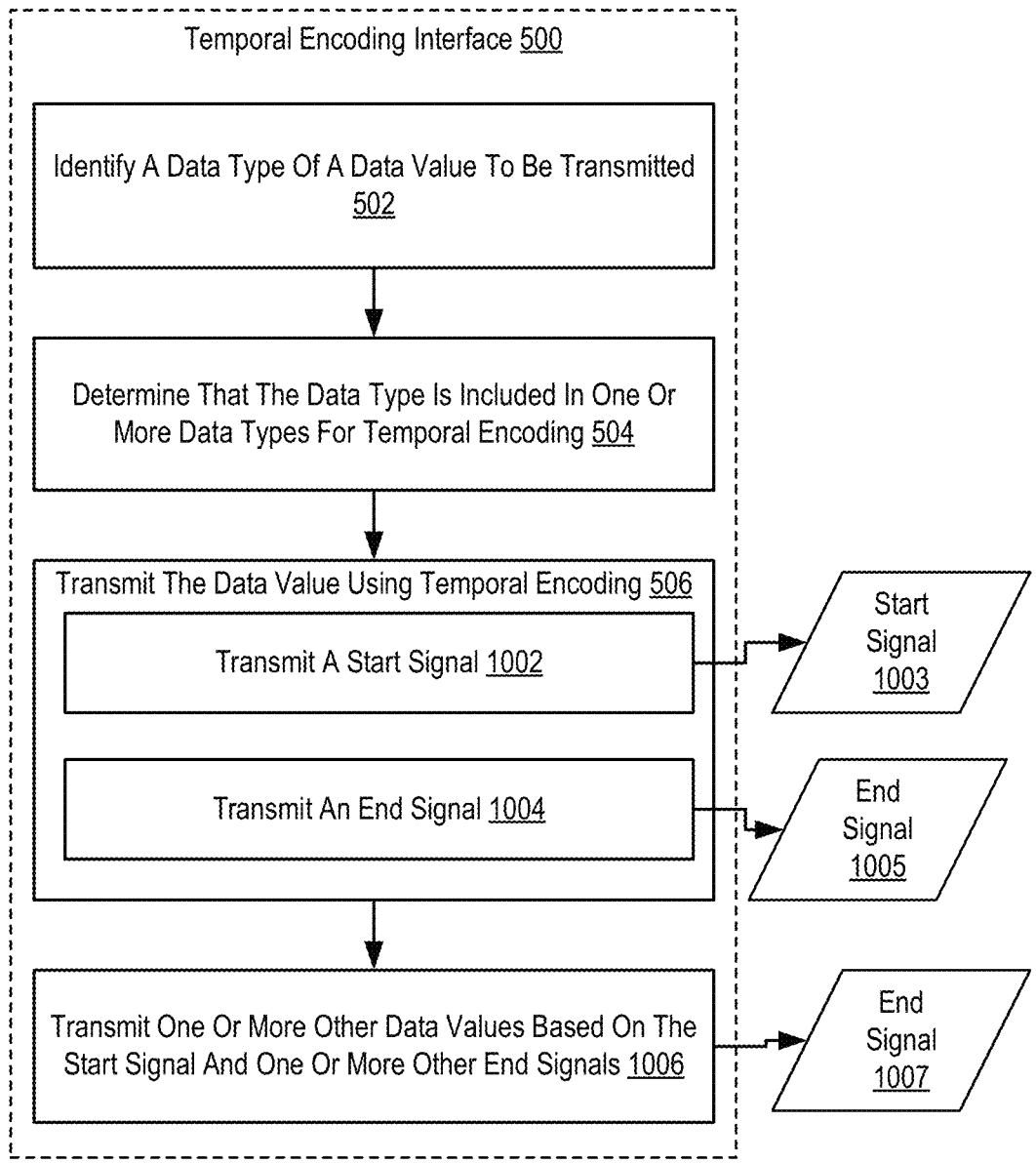
FIG. 10 is a flowchart of an example method for temporal link encoding according to some embodiments.

For further explanation, FIG. 10 sets forth a flow chart illustrating an exemplary method for temporal link encoding that includes identifying 502 (e.g., by a temporal encoding interface 500) a data type of a data value 503 to be transmitted; determining 504 that the data type is included in one or more data types for temporal encoding; and transmitting 506 the data value 503 using temporal encoding.

The method of FIG. 10 differs from FIG. 5 in that transmitting 506 the data value 503 using temporal encoding includes transmitting 1002 a start signal 1003. The start signal 1003 is a start spike indicating the beginning of a time window temporally encoding a data value (e.g., the data value 503). Transmitting 506 the data value 503 using temporal encoding also includes transmitting 1004 an end signal 1005. The end signal 1005 is an end spike indicating the end of a time window encoding the data value 503.

The method of FIG. 10 also includes transmitting 1006 one or more other data values based on the start signal 1003 and one or more other end signals 1007. Each of the other data values is encoded using a time window defined by the start signal 1003 and the respective end signal 1007. In other words, a plurality of data values are transmitted using a single start signal 1003 and multiple end signals 1005, 1007. In some embodiments, metadata is transmitted (e.g., using temporal or binary encoding) indicating a number of data values to be transmitted using temporal encoding. For example, where metadata indicates that four values are to be transmitted, a receiving temporal encoding interface would treat the next five received signals (e.g., spikes) as a start signal 1003 and four end signals 1005, 1007.

In view of the explanations set forth above, readers will recognize that the benefits of temporal link encoding include:
- Improved temporal encoding latency by transmitting multiple temporally encoded values concurrently over the same link.
- Improved temporal encoding latency by transmitting multiple temporally encoded values using a single start spike and multiple end spikes.
- Improved temporal encoding latency by selectively encoding low value data types using temporal encoding.
- Improved power and bandwidth efficiency while improving temporal encoding latency over prior systems.

Exemplary embodiments of the present disclosure are described largely in the context of a fully functional computer system for temporal link encoding. Readers of skill in the art will recognize, however, that the present disclosure also can be embodied in a computer program product disposed upon computer readable storage media for use with any suitable data processing system. Such computer readable storage media can be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the disclosure as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present disclosure.

The present disclosure can be a system, a method, and/or a computer program product. The computer program product can include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes can be made in various embodiments of the present disclosure. The descriptions in this specification are for purposes of illustration only and are not to be construed in a limiting sense. The scope of the present disclosure is limited only by the language of the following claims.

What is claimed is:

1. A method of temporal link encoding, the method comprising:
   identifying a data type of a data value to be transmitted;
   determining, based on an indicator, that the data type should be encoded using temporal encoding based on a number of bits required to encode the data type being below a threshold; and
   transmitting the data value using temporal encoding.

2. The method of claim 1, wherein the data value is transmitted based on a first time window, and the method further comprises transmitting another data value using temporal encoding based on a second time window overlapping the first time window.

3. The method of claim 1, wherein transmitting the data value using temporal encoding comprises transmitting a plurality of temporally encoded messages.

4. The method of claim 1, wherein determining that the data type is included in one or more data types for temporal encoding is based on one or more of a latency requirement or a bandwidth requirement of an application.

5. The method of claim 1:
   wherein transmitting the data value using the temporal encoding comprises:
      transmitting a start signal;
      transmitting an end signal; and
   wherein the method further comprises transmitting one or more other data values based on the start signal and one or more other end signal.

6. An apparatus for temporal link encoding, comprising:
   a first temporal encoding interface;
   a second temporal encoding interface; and
   wherein the apparatus is configured to:
      identify a data type of a data value to be transmitted;
      determine, based on an indicator, that the data type should be encoded using temporal encoding based on a number of bits required to encode the data type being below a threshold; and
      transmit, via the first temporal encoding interface to the second temporal encoding interface, the data value using temporal encoding.

7. The apparatus of claim 6, wherein the data value is transmitted based on a first time window, and the apparatus is further configured to transmit another data value using temporal encoding based on a second time window overlapping the first time window.

8. The apparatus of claim 6, wherein transmitting the data value using temporal encoding comprises transmitting a plurality of temporally encoded messages.

9. The apparatus of claim 6, wherein determining that the data type is included in one or more data types for temporal encoding is based on one or more of a latency requirement or a bandwidth requirement of an application.

10. The apparatus of claim 6:
    wherein transmitting the data value using the temporal encoding comprises:
       transmitting a start signal;
       transmitting an end signal; and
    wherein the apparatus is further configured to transmit one or more other data values based on the start signal and one or more other end signal.

11. A computer program product disposed upon a non-transitory computer readable medium, the computer program product comprising computer program instructions for temporal link encoding that, when executed, cause a computer system to perform steps comprising:

identifying a data type of a data value to be transmitted;

determining, based on an indicator, that the data type should be encoded using temporal encoding based on a number of bits required to encode the data type being below a threshold; and transmitting the data value using temporal encoding.

12. The computer program product of claim 11, wherein the data value is transmitted based on a first time window, and the steps further comprise transmitting another data value using temporal encoding based on a second time window overlapping the first time window.

13. The computer program product of claim 11, wherein transmitting the data value using temporal encoding comprises transmitting a plurality of temporally encoded messages.

14. The computer program product of claim 11, wherein determining that the data type is included in one or more data types for temporal encoding is based on one or more of a latency requirement or a bandwidth requirement of an application.

15. A system for temporal link encoding configured to:

identify a data type of a data value to be transmitted;

determine, based on an indicator, that the data type should be encoded using temporal encoding by determining that a number of bits required to encode the data type falls below a threshold; and transmit the data value using temporal encoding.

16. The system of claim 15, wherein the data value is transmitted based on a first time window, and the system is further configured to transmit another data value using temporal encoding based on a second time window overlapping the first time window.

17. The system of claim 15, wherein transmitting the data value using temporal encoding comprises transmitting a plurality of temporally encoded messages.

18. The system of claim 15, wherein determining that the data type is included in one or more data types for temporal encoding is based on one or more of a latency requirement or a bandwidth requirement of an application.

19. The system of claim 15, wherein:

transmitting the data value using the temporal encoding comprises transmitting a start signal and transmitting an end signal; and the system is further configured to transmit one or more other data values based on the start signal and one or more other end signal.

* * * * *